(12) United States Patent
Hashimoto et al.

(10) Patent No.: US 7,833,681 B2
(45) Date of Patent: Nov. 16, 2010

(54) MASK BLANK AND MASK

(75) Inventors: Masahiro Hashimoto, Shinjuku-ku (JP);
Tomoyuki Enomoto, Toyama (JP);
Takahiro Sakaguchi, Toyama (JP);
Rikimaru Sakamoto, Toyama (JP);
Masaki Nagai, Chiyoda-ku (JP)

(73) Assignees: Hoya Corporation, Tokyo (JP); Nissin Chemical Industries, Ltd., Tokyo (JP)

( * ) Notice: Subject to any disclaimer, the term of this patent is extended or adjusted under 35 U.S.C. 154(b) by 471 days.

(21) Appl. No.: 11/898,587

(22) Filed: Sep. 13, 2007

(65) Prior Publication Data
US 2008/0070132 A1    Mar. 20, 2008

(30) Foreign Application Priority Data
Sep. 15, 2006 (JP) ............... 2006-251813

(51) Int. Cl.
*G03F 1/00* (2006.01)
*G03F 1/08* (2006.01)

(52) U.S. Cl. .............................. 430/4; 430/5
(58) Field of Classification Search ................. 430/4–5
See application file for complete search history.

(56) References Cited

U.S. PATENT DOCUMENTS

| | | | | |
|---|---|---|---|---|
| 2002/0182514 A1* | 12/2002 | Montgomery et al. | .......... | 430/5 |
| 2003/0165747 A1* | 9/2003 | Magg | .............. | 430/5 |
| 2007/0190459 A1* | 8/2007 | Hashimoto et al. | ............. | 430/5 |
| 2009/0047584 A1* | 2/2009 | Hashimoto | ................... | 430/5 |

FOREIGN PATENT DOCUMENTS

JP    A-2003-107675    4/2003

\* cited by examiner

*Primary Examiner*—Mark F Huff
*Assistant Examiner*—John Ruggles
(74) *Attorney, Agent, or Firm*—Oliff & Berridge, PLC

(57) ABSTRACT

A mask blank is equipped with a thin film that forms a mask pattern formed on a substrate and a chemically amplified type resist film that is formed above the thin film. In the mask blank, a protective film that prevents movement of a substance that inhibits a chemical amplification function of the resist film from a bottom portion of the resist film to inside the resist film is provided between the thin film and the resist film. The mask blank suppresses the error of the line width dimension of the transfer pattern formed on the substrate to the design dimension of the transfer pattern line width of the transfer mask (actual dimension error) and also suppress linearity up to 10 nm.

9 Claims, 1 Drawing Sheet

MASK BLANK AND MASK

BACKGROUND

1. Field of the Invention

The present invention relates to mask blanks and masks used in manufacturing semiconductor devices and display devices (display panels).

2. Description of the Related Art

For example, a photomask (reticle) used in the fine processing technology of semiconductor devices is manufactured by patterning a thin film (hereinafter referred to as a thin film, which is used for forming a mask pattern) such as a light-blocking film. The thin film is formed with the main purpose of expressing a transfer function (light-blocking, phase-shift control, transmission rate control, reflection rate control and the like) as a mask pattern formed on a transparent substrate. The patterning of the light-blocking film is performed, for example, by dry etching a resist pattern as a mask. The resist pattern is formed, for example, by electron beam lithography.

In recent years, in the mask manufacturing field, accelerating the voltage of the electron beam used in electron beam lithography to 50 keV or higher has been studied. This is because it is necessary to reduce forward scattering of the electron beam that passes through the electron beam resist and to raise the concentration of the electron beam so that a finer resist pattern can be resolved. If the accelerating voltage of the electron beam is low, the forward scattering will occur at the resist surface or in the resist; when forward scattering occurs, the resolution of the resist will deteriorate. However, if the accelerating voltage of the electron beam is 50 keV or higher, forward scattering is reduced in inverse proportion to the accelerating voltage and the energy applied to the resist is reduced by the forward scattering. Therefore, the sensitivity of the resist is insufficient and throughput ultimately drops with an electron beam resist that is used when the accelerating voltage is 10 to 20 keV, for example. Thus, in the mask manufacturing field, it has been necessary to use a chemically amplified type resist film as has been used in the fine processing technology of semiconductor wafers. Chemically amplified type resist films are highly sensitive to high-accelerating voltages and they have a high resolution (for example, see Japanese Patent Application Publication No. JP-A-2003-107675).

With a chemically amplified type resist, electron beam exposure generates acid in the chemically amplified type resist film. Using this acid as a catalyst, the acid sensitive substance reacts, changing the polymer solubility, thereby attaining either a positive type or negative type of resist.

However, when a chemically amplified type resist film is used in the mask manufacturing field, if the film density near the surface of the film (the film equivalent to the backing for the resist) directly formed by applying a chemically amplified type resist, for example, a thin film that forms a mask pattern, such as a light-blocking type film made of chrome or the like, is comparatively sparse or rough (in other words not smooth), the acid of the catalytic substance generated in the chemically amplified type resist film by electron beam exposure easily moves into the thin film (particularly in the surface layer) that forms the mask pattern that is equivalent to the backing for the resist, and movement is promoted by the acid in the film (particularly in the surface layer) that forms the mask pattern being trapped. Therefore, the concentration of acid in the bottom portion of the resist film notably drops (generally called deactivation). As a result, at an end portion of the resist pattern, the problem of "footing" occurs with the positive type chemically amplified type resist film, and the problem of "undercutting" occurs with the negative type. Conventionally, to resolve these notable shape defect problems of resist patterns caused by deactivation, a configuration has been known, in which a deactivation controlling film is disposed between a thin film that forms the mask pattern and the chemically amplified type resist film. The deactivation controlling film has a density that inhibits movement of the acid in the chemically amplified type resist film into the thin film (particularly in that surface layer) that forms the mask pattern (for example, see Japanese Patent Application Publication No. JP-A-2003-107675). The surface of the deactivation controlling film described in Japanese Patent Application Publication No. JP-A-2003-107675 is smooth compared to the thin film that forms the mask pattern whose surface is comparatively sparse or rough. It is thought that it has a surface state that does not cause "footing" or "undercutting" as a result. Japanese Patent Application Publication No. JP-A-2003-107675 discloses a configuration that introduces a material that includes Si, a silicide type material such as metal silicide, material that includes Mo, an inorganic film of a material that includes Ta, and an organic film of an organic bottom anti-reflective coating as a deactivation controlling film.

However, it was discovered that there are the following problems when the deactivation controlling film described in Japanese Patent Application Publication No. JP-A-2003-107675 is applied in a mask blank used in photolithography of a DRAM half-pitch (hp) up to 65 nm in the semiconductor design rule.

Normally, because photolithography for fine processing of semiconductor substrates is performed with reduced-size projection exposure, the size of the patterns formed on the mask for transfer are about four times the size of the patterns formed on the semiconductor substrate. However, in photolithography with a semiconductor design rule (DRAM hp up to 65 nm), because the size of circuit patterns transferred onto the semiconductor substrate have become much smaller than the wavelength of the exposure light, with reduced-size projection exposure attempting to use a transfer mask formed with a transfer pattern whose circuit pattern is expanded as it is four times, an affect such as interference of the exposure light makes it impossible to transfer the shape of the transfer pattern as it is to the resist film on the semiconductor substrate.

As super-resolution masks, an OPC mask, a phase shift mask (enhancer mask) and the like are used. The OPC mask uses the correction technology of optical proximity effects that degrades transfer characteristics by performing optical proximity effect correction (OPC). The phase shift mask (enhancer mask) uses a structure (mask enhancer) that disposes a phase shifter at a central portion of the light-blocking pattern such as a line shape so as to enhance the light-blocking characteristic of the mask pattern and improve the degree of resolution of the line pattern. For example, it is necessary to form an OPC pattern (for example an assist bar or hammer head of a line width less than 100 nm) of a size up to ½ of the circuit pattern on the OPC mask. Also, a light-blocking pattern and a phase-shifter line with extremely fine line widths are required in the enhancer mask.

Note that the enhancer mask has a distribution so that the amplitude strength of the light passed through the mask enhancer is 0 at the position that corresponds to the center of the mask enhancer, and a distribution so that the strength (the amplitude strength squared) of the light that passed through the mask enhancer is 0 at the position that corresponds to the center of the mask enhancer when the pattern width and the phase shifter width are adjusted so that the strength of the light leaking from around the edges of the light-blocking pattern to the backside of the light-blocking pattern and the strength of the light passing through the phase shifter are exactly balanced.

However, when the deactivation controlling film described in Japanese Patent Application Publication No. JP-A-2003-107675 is applied to a mask blank of a mask for transfer of the semiconductor design rule (DRAM hp up to 65 nm), although a 100 nm line and space pattern is resolved as a chemically amplified type resist pattern on a thin film that forms the mask pattern, the error of the dimension of the transfer pattern actually formed on the substrate to the design dimensions (actual dimension error) is large, and the problem occurs that the linearity up to 10 nm demanded by the above semiconductor design rule (DRAM hp up to 65 nm) cannot be secured.

SUMMARY

The present invention was devised in order to solve the aforementioned problems. It is an object of the present invention to provide a mask blank and mask that suppress the error of the line width dimension of the transfer pattern formed on the substrate to the design dimension of the transfer pattern line width of the transfer mask (actual dimension error) and also suppress linearity up to 10 nm.

The inventor made a thorough examination of the causes for the large dimension errors of the transfer patterns formed on the substrate.

After an ion chromatographic analysis of a substrate that has the deactivation controlling film described in Japanese Patent Application Publication No. JP-A-2003-107675 on the thin film (not including the deactivation controlling film) for forming the mask pattern, it became clear that contaminating substances exist. These contaminating substances were almost completely undetected in an ion chromatographic analysis conducted on the quartz substrate alone, or the quartz substrate/deactivation controlling film alone (therefore, it is determined that the contaminating substances are not caused by the deactivation controlling film or substrate), and a comparatively higher amount was detected in an ion chromatographic analysis conducted only on the thin film substrate that forms the substrate/mask pattern. Therefore, it was clear that these contaminating substance (contaminated ions or the like) appeared by passing from the thin film that forms the mask pattern through the deactivation controlling film.

These contaminating substances (contaminated ions or the like) enter the chemically amplified type resist film passing from the thin film that forms the mask pattern and through the deactivation controlling film thereby decreasing function of the chemically amplified type resist (main reaction). They are a cause of hindering the improvement of linearity and the resolution of chemically amplified type resist. In that case, a decrease in the chemically amplified type resist function (main reaction) is thought to be a decrease in the function as an acid, (for example, a decrease in the catalytic effects (reactivity) of acid, or elimination of the catalytic effects caused by neutralizing of the acid), or a decrease of other reactivities. At that time, there is no decrease in the acid concentration itself in the chemically amplified type resist, and therefore, the concept differs from deactivation caused by a decrease in acid concentration.

Also, it was found that it is necessary to dispose, at the bottom (bottom surface) of the chemically amplified type resist film, a film that can prevent the contaminating substances from entering, in order to further improve the resolution of the chemically amplified type resist formed on the mask blank and the transfer patterns formed with resist patterns as a mask and the precision of the patterns. The film can block (insulate) the contaminating substances that enter from the thin film that forms the mask pattern into the chemically amplified type resist film and cause a decrease in the chemically amplified type resist function (main reaction), from entering from the thin film that forms the mask pattern into the chemically amplified type resist film.

The inventor conducted GIXR analysis on the film formed between the thin film that forms the mask pattern and the chemically amplified type resist film. As a result, the inventor determined that the deactivation controlling film (for example the neutral organic bottom anti-reflective coating) described in the Japanese Patent Application Publication No. JP-A-2003-107675 was unable to adequately inhibit the contaminating substances (contaminated ions or the like) that enter from the bottom (bottom surface) of the resist film into the chemically amplified type resist film, and that it cannot be said that the film density and film thickness are adequate in the point of inhibiting infusing of this contaminating substance.

Also, the inventor arrived at the present invention by discovering that it is necessary to dispose a resin film between the thin film and the chemically amplified type resist film to further improve the resolution of transfer patterns formed with chemically amplified type resist formed on the mask blank, and resist patterns as the mask and to improve pattern precision. The resin film has a predetermined film density (1.4 $g/cm^3$ or more) and film thickness (2 nm or more) having a function to inhibit the movement of substances (ions or the like) that cause a decrease in the chemically amplified type resist function from moving from the bottom portion of the resist film to inside the resist film.

According to the present invention, it is possible to provide a mask blank and transfer mask that can suppress linearity of the transfer pattern formed on the substrate using a resist pattern as a mask up to 10 nm, by forming a chemically amplified type resist pattern by drawing the pattern.

The present invention has the following configuration.

(Aspect 1) A mask blank includes a thin film that forms a mask pattern formed on a substrate; and a chemically amplified type resist film that is formed above the thin film, wherein a protective film that prevents movement of a substance that inhibits a chemical amplification function of the resist film from a bottom portion of the resist film to inside the resist film is provided between the thin film and the resist film.

(Aspect 2) A mask blank includes a thin film that forms a mask pattern formed on a substrate; and a chemically amplified type resist film that is formed above the thin film, wherein a resin film with a thickness equal to or more than 2 nm and a density equal to or more than 1.4 $g/cm^3$ is provided between the thin film and the resist film. Note that the film density is determined using the grazing incidence X-ray reflectivity technique (GIXR).

(Aspect 3) In the mask blank according to aspect 2, the resin film prevents movement of a substance that inhibits a chemical amplification function of the resist film from a bottom portion of the resist film to inside the resist film.

(Aspect 4) In the mask blank according to either aspect 2 or aspect 3, the resin film is configured to be removed in a patterning process of the thin film.

(Aspect 5) In the mask blank according to any one of aspects 1 to 4, the thin film is a metal film.

(Aspect 6) In the mask blank according to any one of aspects 1 to 5, the thin film is formed by a reactive sputtering technique.

(Aspect 7) In the mask blank according to any one of aspects 1 to 6, the mask blank is a mask blank prior to formation of the chemically amplified type resist film.

(Aspect 8) A transfer mask includes a transfer pattern formed on a substrate by patterning the thin film in the mask blank according to any one of aspects 1 to 7.

The following will describe the present invention in detail.

A mask blank according to the present invention includes a thin film that forms a mask pattern formed on a substrate; and a chemically amplified type resist film that is formed above the thin film, wherein a protective film that prevents movement of a substance that inhibits a chemical amplification function of the resist film from a bottom portion of the resist film to inside the resist film is provided between the thin film and the resist film (aspect 1).

According to aspect 1, it is possible to contribute to further improvement of resolution of the transfer patterns formed with chemically amplified type resist and resist patterns as masks, and to contribute to improvement of pattern precision by disposing, between the thin film that forms the mask blank and the chemically amplified type resist film, a protective film that prevents the movement of a substance that inhibits the function of the chemically amplified type resist from the bottom portion of the resist film to inside the resist film.

According to aspect 1, the protective film is disposed at a bottom portion (directly below the bottom surface) of a chemically amplified type resist film. The protective film has a function that blocks a substance (ions) that inhibits the function of the chemically amplified type resist that exists on the thin film that forms the mask pattern from entering from outside the resist film into the chemically amplified type resist film at the bottom portion of the chemically amplified type resist film.

Furthermore, according to aspect 1, a protective film is interposed between a thin film that forms a mask pattern and a chemically amplified type resist. The protective film has a preventive function to prevent a substance (ions) that inhibits the functions of the chemically amplified type resist that exists on the thin film that forms the mask pattern from entering from outside the resist film into the chemically amplified type resist film at the bottom surface of the chemically amplified type resist, thereby increasing the concentration of the substance (ions) included in the chemically amplified type resist.

In addition, a mask blank according to the present invention includes a thin film that forms a mask pattern formed on a substrate; and a chemically amplified type resist film that is formed above the thin film, wherein a resin film with a thickness equal to or more than 2 nm and a density equal to or more than 1.4 g/cm$^3$ is provided between the thin film and the resist film (aspect 2). Note that the film density is determined using the grazing incidence X-ray reflectivity technique.

According to aspect 2, it is possible to contribute to further improvement of resolution of the transfer patterns formed with chemically amplified type resist and resist patterns as masks, and to improvement of pattern precision, because it is possible to effectively inhibit the movement of a substance (ions) that inhibits the functions of the chemically amplified type resist from the bottom portion of the resist film to inside the chemically amplified type resist by interposing a resin film whose thickness is 2 nm or more and density is 1.4 g/cm$^3$ or more between the thin film that forms the mask pattern and the chemically amplified type resist film (aspect 3).

When the numerical values of the film thickness and density fall below that, it may not be possible to securely prevent the movement of the substance (ions) that is a cause of inhibiting the function of the chemically amplified type resist that exists on the thin film that forms the mask pattern into the chemically amplified type resist. Therefore, that is not preferred.

The preferred film thickness and density are a thickness equal to or higher than 2 nm and up to 20 nm, and a density equal to or higher than 1.6 g/cm$^3$; preferably, the film thickness is equal to or higher than 5 nm, and up to 20 nm, and the density is equal to or higher than 1.7 g/cm$^3$. This makes it possible to securely improve the resolution of the transfer pattern formed with the chemically amplified type resist formed on the mask blank and the resist pattern as masks. Specifically, it is possible to securely implement a mask blank that satisfies pattern precisions required for masks used in fine pattern forming with DRAM half-pitch up to 65 nm in the semiconductor design rule.

In the present invention, photo-mask blanks, phase shift mask blanks, reflective type mask blanks and in-print transfer plate substrates are included in mask blanks. Also, mask blanks with resist films, and mask blanks before the resist films are formed (aspect 7) are included in mask blanks. Mask blanks formed on the thin film that forms the mask pattern with a protective film according to the present invention or a resin film according the present invention are included in mask blanks before the resist films are formed. The forming of a light-blocking film such as a chromium-based material on a half-tone film is included in phase-shift mask blanks. Note that in this case, the thin film that forms the mask pattern indicates the half-tone film or the light-blocking film. Also, the reflective type mask blanks include a configuration where an absorbent film of a tantalum- or chromium-based material as the transfer pattern is formed on a multi-layer reflective film or on a buffer layer disposed on the multi-layer reflective film. The in-print transfer plates include a configuration where a thin film for forming a transfer pattern of a chromium-based material is formed on a substrate as the transfer pattern. Photomasks, phase-shift masks, reflective type masks, and in-print transfer plates are included in masks. Reticles are included in masks.

In the present invention, a light-blocking film that blocks exposure light, a semi-permeable film that adjusts and controls the amount of transmission of exposure light or the like, a reflectance ratio control film (including a reflection prevention film) that adjusts and controls the reflectance ratio of exposure light or the like, a phase-shift film that varies the phases for exposure light or the like, and a half-tone film having a light-block function and phase-shifting function are included in thin films that form the mask pattern.

Also, the mask blanks of the present invention are configured so that the resin film or the protective film is removed in the patterning process of the thin film (aspect 4), so it is possible to faithfully transfer the patterns of the chemically amplified type resist formed on the mask blanks to the thin film. In other words, it is possible to transfer to the thin film to maintain the resolution of the chemically amplified type resist film on the mask blank obtained by the resin film or the protective film, so the resolution of the transfer patterns obtained by the patterning of the thin film have an excellent quality and the precision of the patterns is excellent.

The mask blanks of the present invention are particularly effective if the thin film that forms the mask patterns is a metal film (aspect 5). As metal films, chromium, tantalum, molybdenum, titanium, hafnium, tungsten, alloys that include these elements, or films composed of materials that include these elements or metal alloys are all possible.

Also, the thin film of the mask blanks of the present invention that form the mask patterns is formed by the reactive sputtering technique (aspect 6). The reactive gases used when sputtering can be oxygen gas, nitrogen gas, nitric monoxide gas, carbon dioxide gas, hydrocarbon gas, or a gas of a mixture of these. In general, the surface of the thin film that forms the mask pattern formed using the reactive sputtering technique easily becomes a state to easily supplement the substance that inhibits the functions of the chemically amplified type resist (for example, the surface becomes rough), so the aforementioned issues easily become problems. Therefore, it is particularly effective when combining a thin film that forms the mask pattern formed by the reactive sputtering technique and the protective film of the present invention.

As a thin film that forms the mask pattern according to aspect 6 of the present invention, a thin film with an increased dry-etching speed is preferred from the points of finer transfer patterns and improved pattern precision. Specifically, if the metal is chromium, an element to increase the speed of the dry-etching process is added. As added elements to increase the speed of the dry-etching process, oxygen and/or nitrogen can be used.

If oxygen is used in the thin film that includes chromium, the content of oxygen is appropriate within a range of between 5 to 80 atomic percent. If the oxygen content is less than 5 atomic percent, it will be difficult to attain the effect of increasing the dry-etching speed. On the one hand, if the oxygen content exceeds 80 atomic percent, the absorption coefficient of the wavelength (up to 200 nm) of the exposure light applied under a DRAM half-pitch up to 65 nm in the semiconductor design rule, for example, in an ArF excimer laser (wavelength 193 nm) is low, so it is necessary to thicken the film to attain the desired optical density, and pattern precision is not improved. Thus, it is not preferred.

If nitrogen is used in the thin film that includes chromium, the content of nitrogen is appropriate within a range of between 20 to 80 atomic percent. If the nitrogen content is less than 20 atomic percent, it will be difficult to attain the effect of increasing the dry-etching speed. On the other hand, if the nitrogen content exceeds 80 atomic percent, the absorption coefficient of the wavelength (up to 200 nm) of the exposure light applied under a DRAM half-pitch up to 65 nm in the semiconductor design rule, for example, in an ArF excimer laser (wavelength 193 nm) is low, so it is necessary to thicken the film to attain the desired optical density, and pattern precision is not improved. Thus, it is not preferred.

Also, the thin film including chromium may include both oxygen and nitrogen. The content in such a case is preferred to be within a range of 10 to 80 atomic percent for the total of oxygen and nitrogen. The content ratio of oxygen and nitrogen when both are included in the thin film that includes chromium is appropriately determined for a balance of the absorption coefficient or the like, without any particular restrictions.

Note that the chromium thin film that includes oxygen and/or nitrogen may include other elements such as carbon, hydrogen and helium.

Note that from the viewpoint of reducing the amount of oxygen in the dry-etching gas, it is possible to use a dry-etching gas that does not include oxygen.

It is preferable from the viewpoint of improving the precision of patterns of the chromium thin film to perform etching (patterning) on the chromium thin film using the dry-etching process.

It is preferable to use a dry-etching gas composed of chlorine gas or a mixture of chlorine and oxygen gases for the etching of the chromium thin film. The reason is that by performing the dry-etching on the chromium thin film composed of materials including chromium and oxygen, nitrogen, or other elements using the etching gases described above, it is possible to increase the dry-etching speed, shorten the dry-etching time, and form light-blocking film patterns having an excellent shape in the cross-section. Chlorine gases that can be used in the dry-etching process include $Cl_2$, $SiCl_4$, HCl, $CCl_4$, $CHCl_3$.

The mask blank of the present invention is particularly useful in the case where the chemically amplified type resist film is pattern exposed (drawn) by an electron beam accelerated by an accelerating voltage equal to or higher than 50 keV so as to form a resist pattern.

The intent of the present invention is to provide further improvement to the resolution of chemically amplified type resist patterns formed on a mask blank when EB lithography supporting 50 keV is applied.

Note that the chemically amplified type resist film according to the present invention includes a resist film that expresses the resist function when the acid of the catalyst substance generated in the resist film by exposure reacts with functional groups or functional substances that control the solubility of polymers in a subsequent heat treatment process. Here, to express the resist function indicates to dissolve into alkali by removing the functional groups or the like, for example.

The mask blanks of the present invention are particularly useful when a resist pattern of a line width less than 100 nm is formed thereon. Such mask blanks may include an OPC mask or a mask having a mask enhancer structure. In these masks (OPC mask and enhancer mask), the width of an auxiliary pattern is smallest, which is disposed in the surrounding area of the main pattern with the objective of improving the resolution of the main pattern. Therefore, it is particularly useful in manufacturing masks having these patterns.

The transfer mask of the present invention has a transfer pattern formed by patterning the thin film on the substrate in the mask blanks according to the present invention (aspect 8).

The transfer masks of the present invention satisfy the pattern precision demanded of transfer masks that support DRAM half-pitch up to 65 nm in the semiconductor design rule.

According to the present invention, examples of the substrate include a synthetic quartz substrate, a soda-lime glass substrate, an alkali-free glass substrate, a low thermal expansion glass substrate and the like.

DETAILED DESCRIPTION OF EMBODIMENTS

The following will explain a preferred embodiment of the present invention with reference to the drawings.

Figure 1:
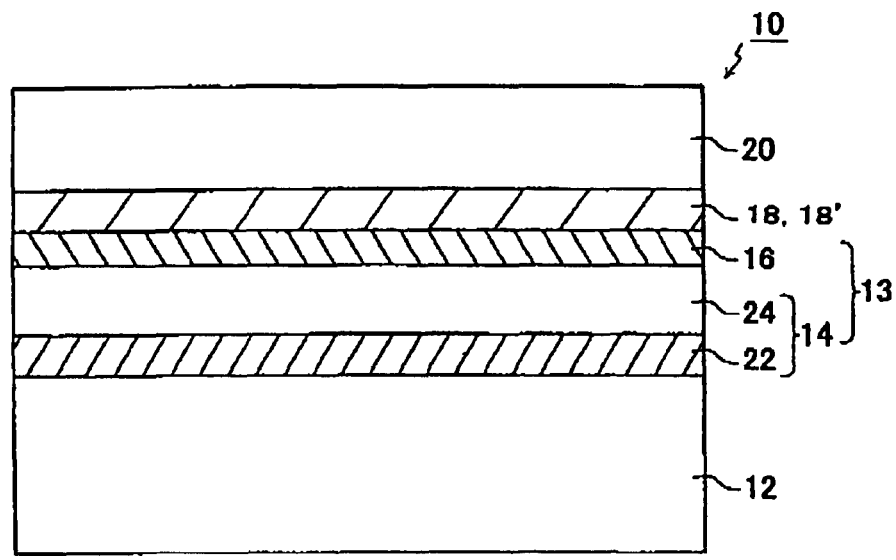
FIG. 1 is a schematic view showing an example of a mask blank 10 according to a first embodiment of the present invention.

FIG. 1 is a schematic view showing an example of a mask blank 10 according to a first embodiment of the present invention. In this example, the mask blank 10 is a mask blank for a binary mask, and is equipped with a transparent substrate 12; a light-blocking film 13 (a laminated film of a light-blocking layer 14 and a reflection preventing layer 16); a protective layer 18; and a chemically amplified type resist film 20.

The transparent substrate 12 is composed of a material such as a synthetic quartz substrate, and soda-lime glass, for example. The light-blocking film 13 is a laminated film of the light-blocking layer 14 and the reflection preventing layer 16.

The light-blocking layer 14 has a chromium nitride film 22 and a chromium carbonitride film 24 in that order on the transparent substrate 12. The chromium nitride film 22 is a layer whose main component is chromium nitride (CrN), and has a film thickness of 10 to 20 nm, for example. The chromium carbonitride film 24 is a layer whose main component is chromium carbonitride (CrCN), and has a film thickness of 25 to 60 nm, for example.

The reflection preventing layer 16 is a film (CrON film) of chromium with oxygen and nitrogen; and is formed on the chromium carbonitride film 24. The film thickness of the reflection preventing layer 16 is 15 to 30 nm, for example.

The light-blocking layer 14 and reflection preventing layer 16 can be deposited using the reactive sputtering technique in a reactive gas atmosphere (for example, oxygen gas, nitrogen gas, nitric monoxide gas, carbon dioxide gas, hydrocarbon gas, or a gas of a mixture of these) using chromium as the sputtering target.

Note that the light-blocking film 13 is composed of the chromium nitride film 22, chromium carbonitride film 24, and chromium oxynitride from the transparent substrate 12 side, and includes chromium and at least one element of oxygen and nitrogen in substantially the entire area of the thickness direction of the light-blocking film 13 or, further, includes mainly much nitrogen in each layer. Consequently, it is possible to increase the dry-etching speed of the light-blocking film 13 when dry etching by use of chlorine gas is performed.

Also, as a material for the light-blocking film 13, chromium alone or a substance including chromium and at least one element compose of oxygen, nitrogen, carbon or hydrogen may be used. As a film structure of the light-blocking film 13, it is possible for single layers or a plurality of layers composed of the above film materials. Also, in a different composition, it is possible for a structure of a plurality of layers formed in steps, or a film structure whose composition is consecutively varied.

The protective film 18 is a layer that prevents the drop in the function of the chemically amplified type resist film 20 (i.e. the layer that prevents a substance that inhibits the chemical amplification function from moving from the bottom portion of the chemically amplified type resist film 20 to inside the chemically amplified type resist film); it is formed on the light-blocking film 13 sandwiching the reflection preventing layer 16.

Note that it is preferred that the protective film 18 has a durability toward developing fluids used when forming a resist pattern on the chemically amplified type resist film 20, and the etching rate is high for the etchant used when etching the protective film. It is further preferred that the protective film 18 can be etched with an etchant used in etching of the light-blocking film 13 using the resist pattern as a mask, and that the etching rate of the protective film 18 is high.

Note that in a modified embodiment, the mask blanks 10 can be mask blanks for phase shift masks. In this case, the mask blank 10 is further equipped with a phase shift film between the transparent substrate 12 and the light-blocking film 13, for example. As a phase shift film, it is possible to use each of the known half-tone films of chromium (CrO, CrF or the like), molybdenum (MoSiON, MoSiN, MoSiO or the like), tungsten (WSiON, WSiN, WSiO or the like), or silicon (SiN, SiON or the like), for example. The mask blank 10 for the phase shift mask can be equipped with a phase shift film on the light-blocking film 13.

The following will explain examples and a comparative example of the present invention.

Example 1

Manufacturing of a Mask Blank with a Resist Film

As the transparent substrate 12, a synthetic quartz substrate of size 6 inch square, and thickness of 0.25 inches was used. The light-blocking film 13, the chromium nitride film 22, the chromium carbonitride film 24, and the chromium oxynitride film (the reflection preventing layer 16) were formed continuously on the transparent substrate 12 using the sputtering technique (see FIG. 1). The light-blocking film 13 was configured to contain nitrogen in substantially the entire area in the film thickness direction and to have each layer thereof mainly containing nitrogen, so as to have an increased dry-etching speed. The film thickness of the light-blocking film 13 was 68 nm.

Next, after forming, on the light-blocking film 13, the protective film 18 composed of a novolak type resin that contains bromine atoms by a spin-coating technique, this was heat treated at 150° C. for 10 minutes, to form a thickness of 10 nm (see FIG. 1).

Next, as the chemically amplified type resist film 20, a chemically amplified type positive resist (FEP171: Made by Fuji Film Electronic Materials Co., Ltd.) for electron beam exposure was dispensed at a thickness of 300 nm using the spin-coating technique. Then, after heat treatment for 10 minutes at 130° C. on a hot plate, the chemically amplified type resist film 20 was dried to attain the mask blank 10 that is the photo-mask blank with a resist film for ArF excimer laser exposure (see FIG. 1).

Comparative Example 1

Manufacturing of a Mask Blank with a Resist Film

As the transparent substrate 12, a synthetic quartz substrate of size 6 inch square, and thickness of 0.25 inches was used. The light-blocking film 13, the chromium nitride film 22, the chromium carbonitride film 24, and the chromium oxynitride film (the reflection preventing layer 16) were formed continuously on the transparent substrate 12 using the sputtering technique (see FIG. 1). The light-blocking film 13 was configured to contain nitrogen in substantially the entire area in the film thickness direction and to have each layer thereof mainly containing nitrogen, so as to have an increased dry-etching speed. The film thickness of the light-blocking film 13 was 68 nm.

Next, an organic bottom anti-reflective coating (BARL manufactured by Shipley) was dispensed to 10 nm using the spin-coating technique to form the deactivation controlling film 18' (see FIG. 1).

Next, as the chemically amplified type resist film 20, a chemically amplified type positive resist (FEP171: Made by Fuji Film Electronic Materials Co., Ltd.) for electron beam exposure was dispensed at a thickness of 300 nm using the spin-coating technique. Then, after heat treatment for 10 minutes at 130° C. on a hot plate, the chemically amplified type resist film 20 was dried to attain the mask blank 10 that is the photo-mask blank with a resist film for ArF excimer laser exposure (see FIG. 1).

(GIXR Analysis)

The film densities of the substrate sample prior to formation of the chemically amplified type resist film 20 in Example 1 and the Comparative Example 1 were found using the Grazing Incidence X-ray reflectivity technique (or GIXR). Note that the wavelength of the incident X-ray used with the Grazing Incidence X-ray Reflective technique was 0.1541 nm (CuKα 1 ray).

The result was that the film density of the deactivation controlling film 18' in the substrate sample according to Comparative Example 1 was 1.3 g/cm$^3$.

Conversely, the film density of the protective film 18 in the substrate sample according to Example 1 was 1.8 g/cm$^3$.

(Forming of Resist Patterns)

A chemically amplified type resist pattern was formed to compare the differences in resolution of chemically amplified type resist patterns on mask blanks according to Example 1 and Comparative Example 1. Specifically, an electron beam exposure system was used to expose each mask blank to pattern exposures (drawing) by an electron beam accelerated by an accelerating voltage over 50 keV. Then, after exposure, the patterns were baked and developed to form the chemically amplified type resist patterns.

The result was that it was confirmed that footing-shaped projections were not formed at the footings of the chemically amplified type resist pattern in Example 1 and Comparative Example 1. Also, it was confirmed in Example 1 that the chemically amplified type resist pattern having 80 nm-lines and spaces was resolved, and in Comparative Example 1, the chemically amplified type resist pattern having 100 nm-lines and spaces was merely resolved.

(Manufacturing of Masks)

Next, the resist pattern was used as a mask, and the protective film 18 or deactivation controlling film 18' and light-blocking film 13 were patterned using a dry-etching process that uses an etching gas including chlorine gas and oxygen gas. Then, the chemically amplified type resist film 20 and protective film 18 or deactivation controlling film 18' were removed by soaking into an aqueous alkaline solution.

When the pattern of the light-blocking film 13 was investigated under SEM (scanning electron microscope), the pattern having 80 nm-lines and spaces was resolved in Example 1, and the pattern edge roughness was low and good. On the other hand, in Comparative Example 1, the pattern of the light-blocking film 13, which has 100 nm-lines and spaces was merely resolved.

Figure 2:
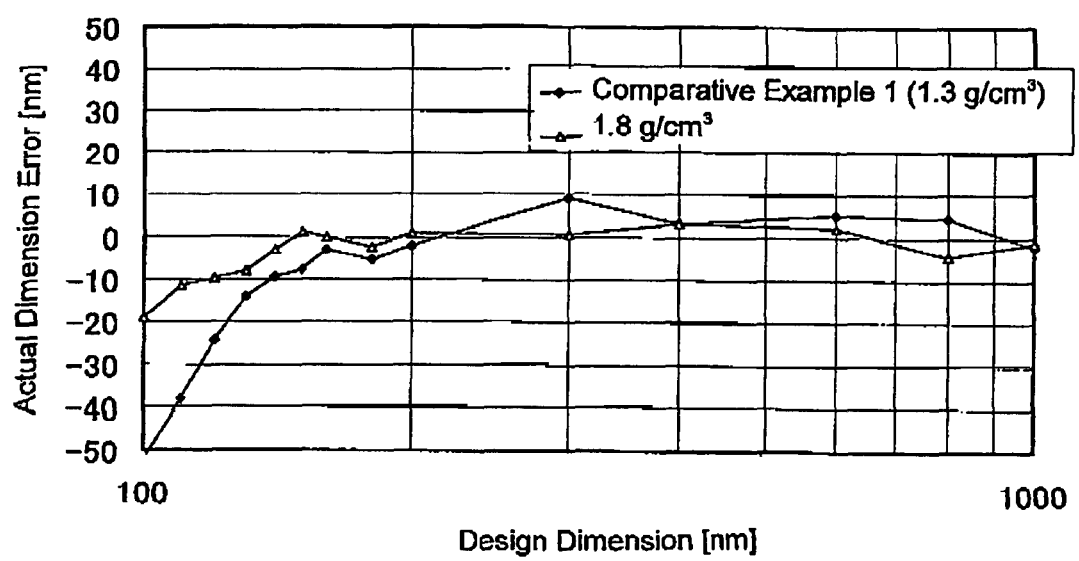
FIG. 2 shows the results of an investigation of actual dimension error to design dimension of the mask patterns of Example 1 and Comparative Example 1.

FIG. 2 shows the results of an investigation of actual dimension error to design dimension of the mask patterns of Example 1 and Comparative Example 1. In Example 1, the actual dimension error was up to 10 nm for the design dimensions from 120 nm to 1000 nm, but for Comparative Example 1, the actual dimension error was 25 nm for the design dimension of 120 nm to 1000 nm. The mask of Example 1 satisfied the linearity up to 10 nm in a DRAM half-pitch of 65 nm in the semiconductor design rule.

Example 2

Mask blanks and masks were made in the same way as Example 1, except that an acrylic resin was used instead of the protective film of Example 1. Note that the film thickness of the protective film was 25 nm. The film density of the protective film was measured in the same way as above using the GIXR analysis, and it was 1.4 g/cm$^3$.

Note that resolution of the chemically amplified type resist pattern having 80 nm-lines and spaces was also confirmed in Example 2.

Also, in the manufactured mask, a pattern with 80 nm-lines and spaces composed of light-blocking film pattern was resolved, and the actual dimension error was up to 10 nm for the design dimension of 120 nm to 1000 nm, and satisfied the linearity up to 10 nm in the DRAM half-pitch of 65 nm in the semiconductor design rule.

Examples 3 and 4

By adjusting the molecular weight, viscosity and baking conditions of the protective film of Example 2, as necessary, mask blanks (density of 2.3 g/cm$^3$ and film thickness of 5 nm; Example 3) that differ in film density and film thickness, and mask blanks whose film density is 1.5 g/cm$^3$ and film thickness is 20 nm (Example 4), were manufactured. Further, masks were manufactured using these mask blanks.

The result was that resolution of the chemically amplified type resist pattern having 80 nm-lines and spaces was confirmed, as in Example 2.

Also, in the manufactured mask, a pattern with 80 nm-lines and spaces composed of light-blocking film pattern was resolved, and the actual dimension error was up to 10 nm for the design dimension of 120 nm to 1000 nm, and satisfied the linearity up to 10 nm in the DRAM half-pitch of 65 nm in the semiconductor design rule.

Note that in Example 3, when the film density of the protective films was made higher and the film thickness was set to 2 nm, the same effects as Example 2 were confirmed.

The above explained the present invention using the embodiments and examples, but the scope of the technology of the present invention is not limited to the scope of the description of the foregoing embodiments and examples. It should be clear to those skilled in the art that it is possible to add various changes or modifications to the aforementioned embodiments and examples. It is also clear in the description of the scope of the claims that embodiments added with such various changes or modifications may be included in the technical scope of the present invention.

The present invention can be suitably used in mask blanks and masks used in manufacturing semiconductor devices, flat-panel displays (FPD), LCD devices, and the like.

What is claimed is:

1. A mask blank comprising:
a thin film that forms a mask pattern formed on a substrate; and
a chemically amplified resist film that is formed above the thin film;
wherein
a resin film with a thickness equal to or more than 2 nm and up to 25 nm and a density equal to or more than 1.4 g/cm$^3$ is provided between the thin film and the resist film, where the resin film is made of a material that is etchable with an etchant used in etching of the thin film, and the film density is determined using grazing incidence X-ray reflectivity technique (GIXR).

2. The mask blank according to claim 1, wherein the resin film prevents movement of a substance that inhibits a chemical amplification function of the resist film from a bottom portion of the resist film to inside the resist film.

3. The mask blank according to claim 1, wherein the resin film is configured to be removed in a patterning process of the thin film.

4. The mask blank according to claim 1, wherein the thin film is a metal film.

5. The mask blank according to claim 1, wherein the thin film is formed by a reactive sputtering technique.

6. The mask blank according to claim 1, wherein the mask blank is a mask blank prior to formation of the chemically amplified resist film.

7. A transfer mask including a transfer pattern formed on a substrate by patterning the thin film in the mask blank according to claim 1.

8. The mask blank according to claim 1, wherein the thickness of the resin film is equal to or more than 2 nm and up to 20 nm, and the density of the resin film is equal to or more than 1.6 g/cm$^3$.

9. The mask blank according to claim 1, wherein the thickness of the resin film is equal to or more than 5 nm and up to 20 nm, and the density of the resin film is equal to or more than 1.7 g/cm$^3$.

* * * * *